(12) United States Patent
Shih

(10) Patent No.: US 10,049,877 B1
(45) Date of Patent: Aug. 14, 2018

(54) PATTERNING METHOD

(71) Applicant: NANYA TECHNOLOGY CORPORATION, New Taipei (TW)

(72) Inventor: Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 6 days.

(21) Appl. No.: 15/604,673

(22) Filed: May 25, 2017

(51) Int. Cl.
 *H01L 21/033* (2006.01)
(52) U.S. Cl.
 CPC ...... *H01L 21/0337* (2013.01); *H01L 21/0332* (2013.01)
(58) Field of Classification Search
 CPC .............. H01L 21/0337; H01L 21/0332
 See application file for complete search history.

(56) References Cited

U.S. PATENT DOCUMENTS

| 7,776,750 B2 * | 8/2010 | Kim ............... H01L 21/0337 |
| | | 257/E21.035 |
| 9,159,560 B2 | 10/2015 | Seo | |
| 2009/0163017 A1 | 6/2009 | Cho | |
| 2013/0059435 A1 | 3/2013 | Yang et al. | |
| 2014/0273471 A1 * | 9/2014 | Gwak ............ H01L 27/10852 |
| | | 438/702 |

* cited by examiner

*Primary Examiner* — Kyoung Lee
*Assistant Examiner* — Christina Sylvia
(74) *Attorney, Agent, or Firm* — CKC & Partners Co., Ltd.

(57) ABSTRACT

A method for forming fine patterns is described. A bottom layer, a hard mask layer, a buffer mask layer and a mask layer are sequentially formed on a substrate. The mask layer and the buffer mask layer are patterned to form first columnar bodies. The buffer mask layer is partially removed in the first columnar bodies and a sacrifice dielectric material is filled in the first gap between the first columnar bodies. The sacrifice dielectric material is patterned to form second columnar bodies. A conformal spacer layer is deposited on the second columnar bodies, and the conformal spacer layer forms spaced columnar body between the adjacent second columnar bodies. A second gap is formed between the spaced columnar body and the second columnar body. A core mask layer is formed in the second gaps. The mask layer and the sacrifice dielectric material are removed.

19 Claims, 6 Drawing Sheets

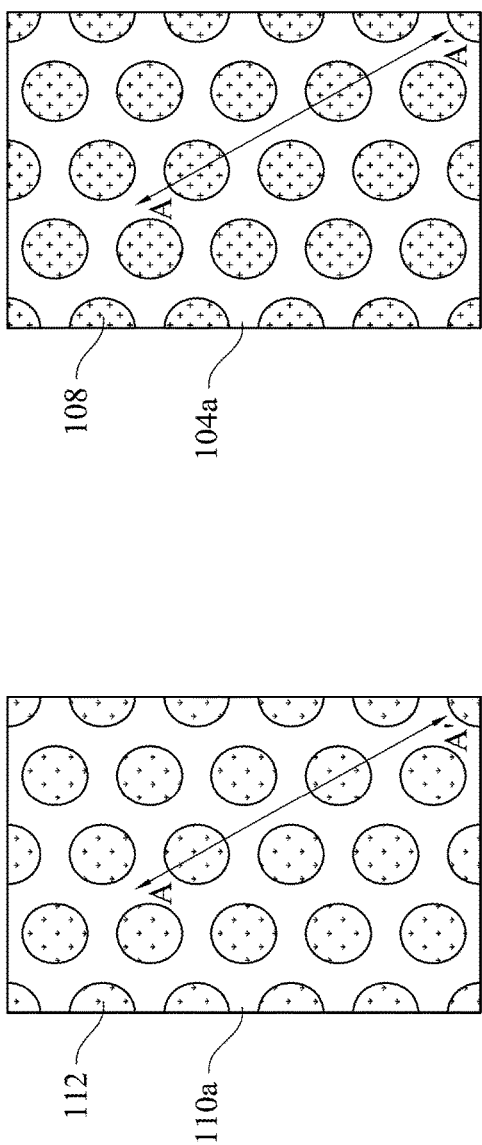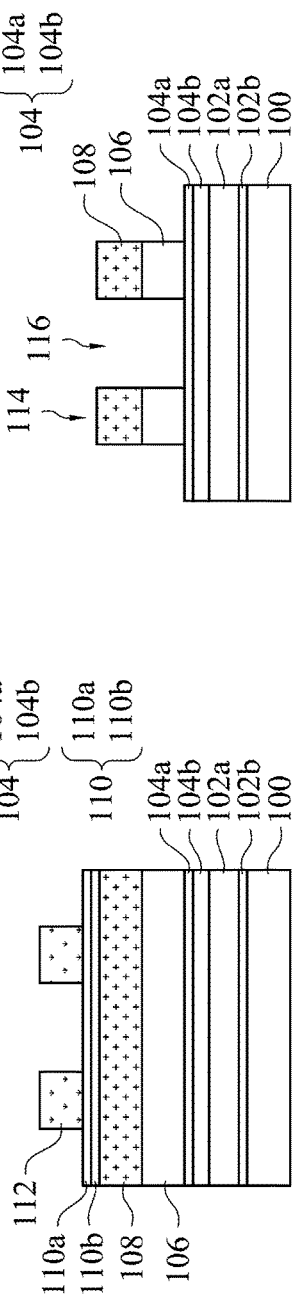

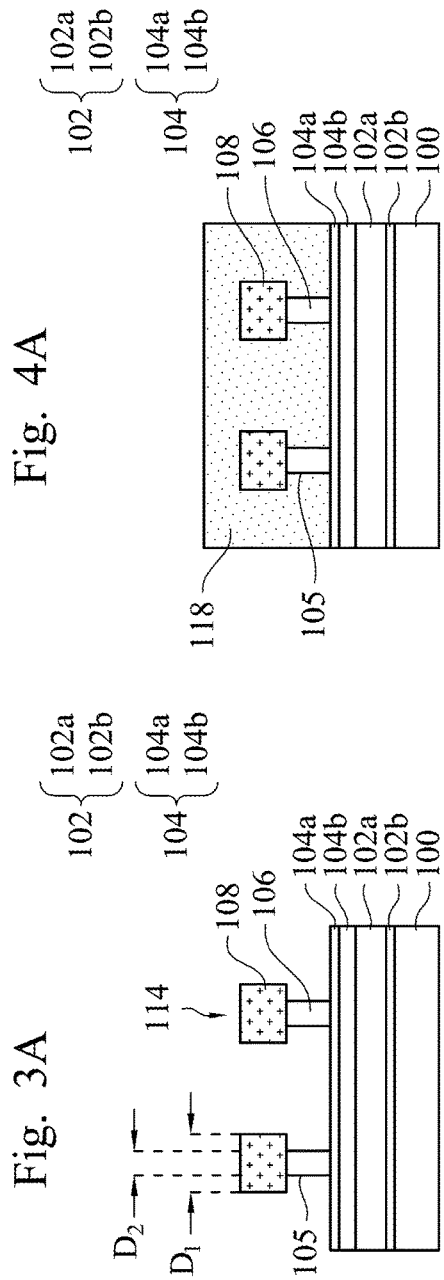
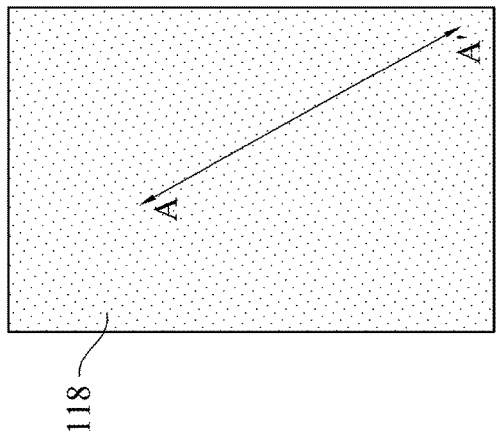
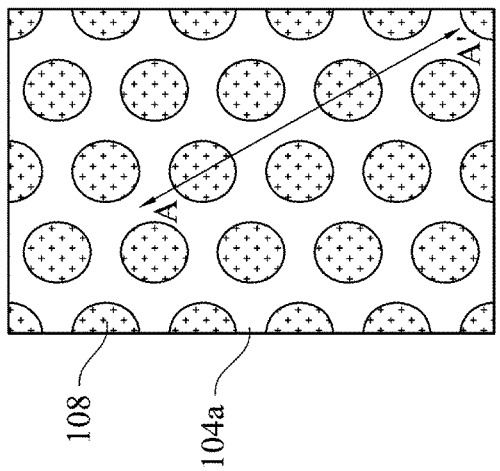

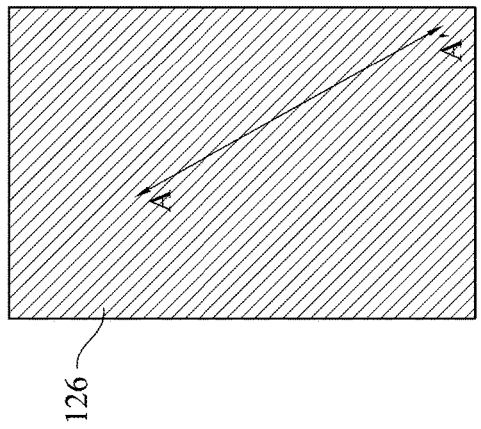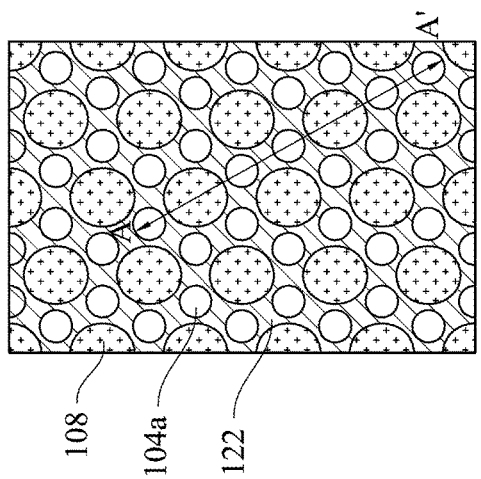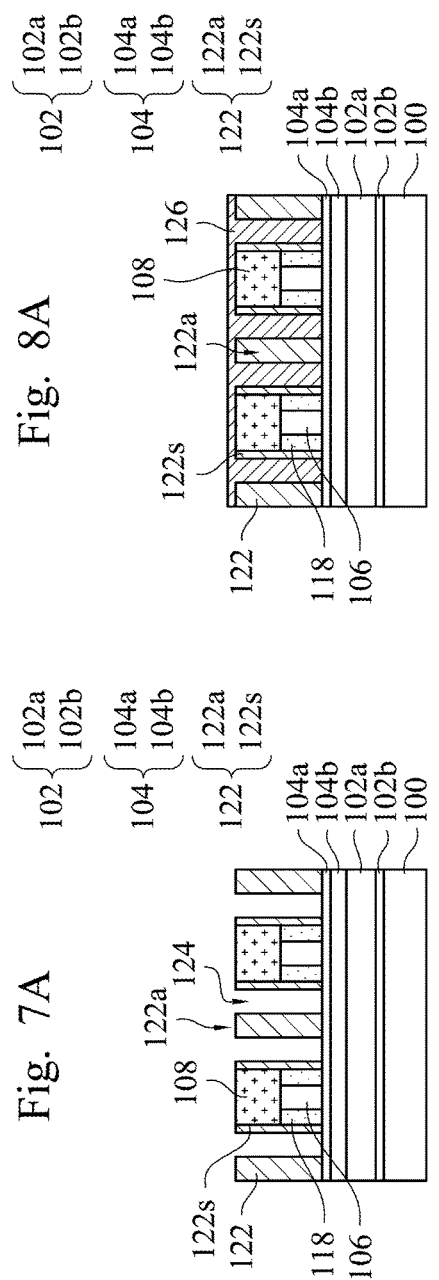

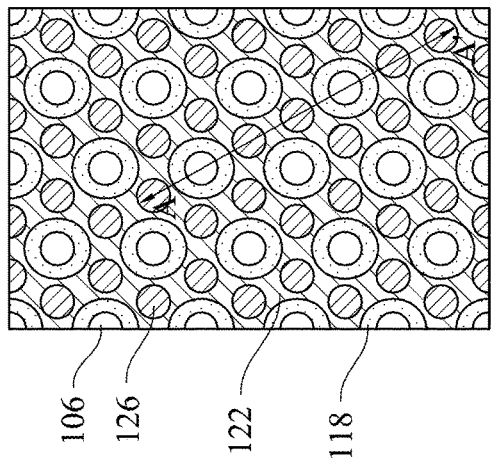
Fig. 9A
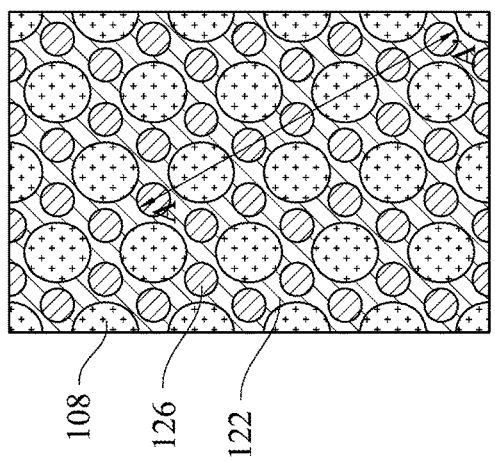
Fig. 10A
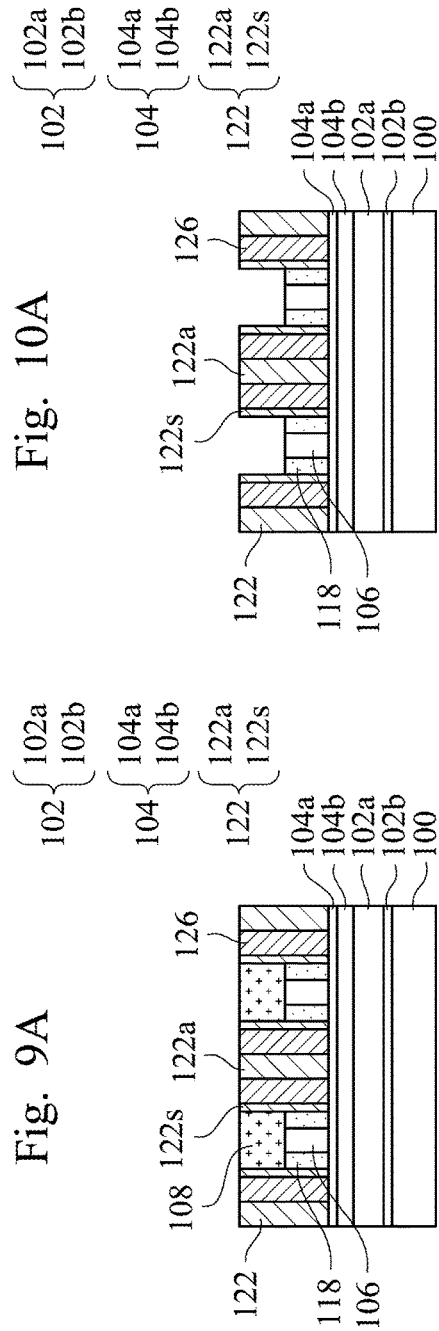
Fig. 9B
Fig. 10B

PATTERNING METHOD

BACKGROUND

Field of Invention

This disclosure relates to a patterning method. More particularly, this disclosure relates to a method of forming a fine pattern of a semiconductor device.

Description of Related Art

In a semiconductor process, the lithography process is a process for transferring a circuit pattern of a photomask onto a wafer, and the patterning process comprises the following steps. First, a mask layer is formed on a bottom substrate. Then, the mask layer is exposed and developed by using the photomask having a custom circuit pattern as a mask. The bottom substrate is then etched by using the patterned mask layer as a mask. In general, in the process of the integrated circuit product, a considerable number of patterning processes are carried out to transfer the circuit pattern onto each material layer.

In order to overcome the limitations of light source resolution in the lithography process, a double patterning process has been developed to increase the accumulation of components. In the double patterning process, the mask layer on the bottom substrate is patterned twice using a photomask to form a patterned mask layer. In other words, two sets of different patterns are transferred to the mask layer by sequentially performing two photoresist coating, exposure, development, and etching steps on the mask layer. In this way, in the patterned mask layer, the line width of the pattern is smaller than the line width of the pattern on any of the photomasks used. Then, the patterned mask layer is used to pattern the bottom substrate to form a device having a smaller line width.

However, the conventional dual patterning process has the drawback of complicated steps, and it is necessary to perform two immersion lithography processes, thereby increasing the process time and process cost of the integrated circuit.

SUMMARY

The present disclosure provides a patterning method. The patterning method includes several steps. First, sequentially forming a bottom layer, a hard mask layer, a buffer mask layer and at least one mask layer on a substrate. Then, patterning the mask layer and the buffer mask layer to form a plurality of first columnar bodies. Next, removing a portion of the buffer mask layer in the first columnar bodies. Then, filling a sacrificial dielectric material in a plurality of first gaps between the first columnar bodies. Next, patterning the sacrificial dielectric material by using the mask layer of the first columnar bodies as a mask to form a plurality of second columnar bodies. Then, depositing a spacer layer on the second columnar bodies and forming a spaced columnar body between the adjacent second columnar bodies, wherein a second gap is between the spaced columnar body and the second columnar body. Next, etching the spacer layer to expose the hard mask layer under the second gaps. Then, forming a core mask layer within the second gaps. Next, removing the mask layer and the sacrificial dielectric material and removing a portion of the hard mask layer and the bottom layer by using the core mask layer and the buffer mask layer as a mask.

In one or more embodiments, the method further comprising forming a plurality of columnar patterned photoresists on the mask layer, and patterning the mask layer and the buffer mask layer by using the columnar patterned photoresist as a mask, before patterning the mask layer and the buffer mask layer to form the plurality of first columnar body.

In one or more embodiments, removing the portion of the buffer mask layer in the first columnar bodies, wherein the mask layer has a first width and the remaining buffer mask layer has a second width, and the first width is greater than the second width.

In one or more embodiments, removing the portion of the buffer mask layer in the first columnar bodies comprising anisotropic etching the buffer mask layer.

In one or more embodiments, depositing the spacer layer on the second columnar bodies and forming the spaced columnar body between the adjacent second columnar bodies, wherein the second gap is between the spaced columnar body and the second columnar body comprises controlling a deposited thickness of the conformal spacer layer to let a vertical portion of the spacer layer covering the adjacent second columnar bodies to be in contact with each other.

In one or more embodiments, the method further comprises removing a portion of the core mask layer to expose the mask layer.

In one or more embodiments, the sacrificial dielectric material is flowable oxide or spin-on glass (SOG).

In one or more embodiments, the material of the core mask layer is the same as the material of the buffer mask layer.

In one or more embodiments, the material of the conformal spacer layer is the same as the material of the sacrificial dielectric material.

In one or more embodiments, the second columnar body comprising: an upper portion, comprising the mask layer; and a lower portion, comprising the buffer mask layer and the sacrificial dielectric material.

In one or more embodiments, the lower portion of the second columnar body comprising a circular pattern with the buffer mask layer surrounding by the sacrificial dielectric material.

In one or more embodiments, removing the mask layer and the sacrificial dielectric material further comprising: removing the mask layer to expose the sacrificial dielectric material and the buffer mask layer; and removing the spacer layer and the sacrificial dielectric material to expose a portion of the hard mask layer.

In one or more embodiments, the hard mask layer includes $SiO_2$ and $Si_3N_4$.

In one or more embodiments, the mask layer comprises $SiO_2$ and $Si_3N_4$.

In one or more embodiments, the core mask layer comprises $SiO_2$, $Si_3N_4$ and SiON.

In one or more embodiments, the spacer layer comprises $SiO_2$.

In one or more embodiments, the buffer mask layer comprises $SiO_2$ and $Si_3N_4$.

In one or more embodiments, filling the sacrificial dielectric material in the first gaps between the first columnar bodies, wherein the filled sacrificial dielectric material is in contact with a pair of sidewalls of the buffer mask layer In one or more embodiments, removing the portion of the hard mask layer and the bottom layer by using the core mask layer and the buffer mask layer as the mask, further comprising: removing the portion of the hard mask layer by using the core mask layer and the buffer mask layer as the mask; removing the core mask layer and the buffer mask layer; and removing a portion of the bottom layer by using the remaining hard mask layer as the mask.

In one or more embodiments, removing the portion of the buffer mask layer in the first columnar bodies comprises forming a T shape first columnar bodies.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 1A to FIG. 12B are top views and cross-sectional views illustrating a method of forming a fine pattern in a semiconductor element according to an embodiment of this disclosure.

DETAILED DESCRIPTION

Figure 5A:
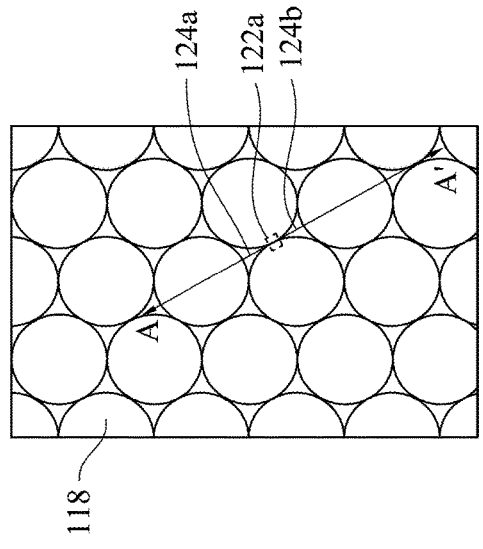

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or features relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 12B are top views and cross-sectional views illustrating a method of forming a fine pattern in a semiconductor element according to an embodiment of the present disclosure. FIGS. 1B, 2B, 3B, 4B, 5B, 6B, 7B, 8B, 9B, 10B, 11B, and 12B are cross-sectional views of the semiconductor element taken along line A-A' of FIGS. 1A, 2A, 3A, 4A, 5A, 6A, 7A, 8A, 9A, 10A, 11A, 12A.

In the embodiment shown in FIGS. 1A and 1B, a bottom layer 102, a hard mask layer 104, a buffer mask layer 106, a second mask layer 108, a first mask layer 110 and a plurality of patterned photoresist layer 112 are sequentially formed on a substrate 100. In the present embodiment, the bottom layer 102 includes an upper bottom layer 102a and a lower bottom layer 102b, and the hard mask layer 104 includes an upper hard mask layer 104a and a lower hard mask layer 104b, and the first mask layer 110 includes an upper first mask layer 110a and the lower first mask layer 110b. The material of the substrate 100 may be a semiconductor substrate, such as silicon, SiGe, $SiO_2$, $Si_3N_4$, SiON, aluminum, tungsten, tungsten silicide, gallium arsenide, germanium, tantalum, tantalum nitride or mixtures of the above. The material of the substrate 100 may also be a complementary metal-oxide-semiconductor (CMOS). The bottom layer 102 may be a stacked structure or a single layer structure. The material of the bottom layer 102 may be dielectric or conductor. The material of the hard mask layer 104 is, for example, $SiO_2$, $Si_3N_4$, C, Si, SiON, SiCN, SiC. The material of the buffer mask layer 106 is, for example, $SiO_2$, $Si_3N_4$, C, Si, SiON, SiCN, SiC. The material of the hard mask layer 104 and the buffer mask layer 106 may be different materials for subsequent implementation of the selective etching process. The material of the second mask layer 108 is, for example, Si, C, SiON, $SiO_2$, $Si_3N_4$, SiCN, SiC. The material of the first mask layer 110 is, for example, $SiO_2$, $Si_3N_4$. The method of forming the bottom layer 102, the hard mask layer 104, the buffer mask layer 106, the second mask layer 108, and the first mask layer 110 includes, for example, chemical vapor deposition process (CVD).

Referring again to FIGS. 1A and 1B, in the present embodiment, the photoresist layer is exposed and developed by a photomask (not shown) to form a patterned photoresist layer 112 above the first mask layer 110.

In the embodiment shown in FIGS. 2A and 2B, the first mask layer 110, the second mask layer 108, and the buffer mask layer 106 are patterned by using the patterned photoresist layer 112 as a mask. Next, the patterned first mask layer 110 is removed to form a plurality of first columnar bodies 114 and a plurality of first gaps 116. Each of the first columnar bodies 114 includes an upper portion and a lower portion. In the present embodiment, the upper portion of the first columnar body 114 comprising second mask layer 108, and the lower portion of the first columnar body 114 comprising buffer mask layer 106. For example, the first mask layer 110, the second mask layer 108 and the buffer mask layer 106 are etched by using the hard mask layer 104 as a stop layer, next, by removing the patterned photoresist layer 112 and the patterned first mask layer 110 to form a plurality of circular patterned second mask layers 108 as shown in FIG. 2A.

In the embodiment shown in FIGS. 3A and 3B, a portion of the lower portion of the first columnar body 114 is removed. In the present embodiment, a portion of the buffer mask layer 106 of the first columnar body 114 is removed, therefore, the second mask layer 108 of the first columnar body 114 has a first width $D_1$, and the remaining buffer mask layer 106 of the first columnar body 114 has a second width $D_2$, and the first width $D_1$ is greater than the second width $D_2$. In the first columnar body 114, the second width $D_2$ of the buffer mask layer 106 refers to the width between a pair of sidewalls 105, which are substantially perpendicular to the hard mask layer 104. In some embodiments, the buffer mask layer 106 is selectively etched, therefore the buffer mask layer 106 has a lateral etching with respect to the second mask layer 108, wherein the amount of the lateral etching may vary, and the amount of the lateral etching increases as the selective etching time increases. In another embodiment, anisotropic etching is used to remove a portion of the buffer mask layer 106 of the first columnar body 114. Therefore, the first columnar body 114 has a T-shaped, with the upper portion wider than the lower portion.

In the embodiment shown in FIGS. 4A and 4B, the sacrificial dielectric material 118 is filled to cover the first columnar bodies 114. In one embodiment, the sacrificial dielectric material 118 is filled in the first gap 116, which is existed between the first columnar bodies 114. The filled sacrificial dielectric material 118 contacts the sidewalls 105 of the buffer mask layer 106. In some embodiment, the sacrificial dielectric material 118 is a flowable dielectric material. After the flowable dielectric material is filled in the first gap 116, a thermal process is performed to convert the flowable dielectric material to the sacrificial dielectric material 118. In one embodiment, the sacrificial dielectric material 118 includes flowable oxide (FOX) or spin-on glass (SOG). The sacrificial dielectric material 118 includes, for example, $SiO_2$.

Figure 5B:
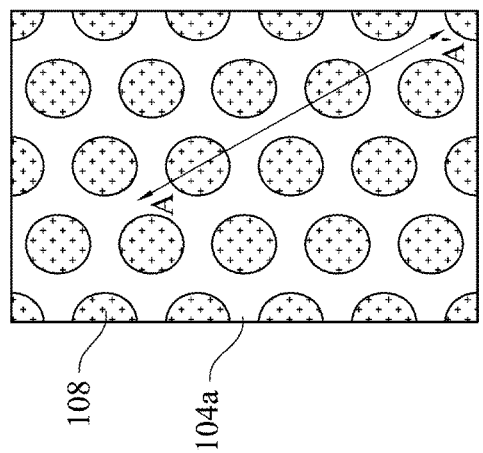

In the embodiment shown in FIGS. 5A and 5B, the planarization process is performed to expose the second mask layer 108. Then, the sacrificial dielectric material 118 is selectively removed to form a plurality of second columnar bodies 120 by using the second mask layer 108 of the first columnar body 114 as a mask. Each of the second columnar bodies 120 includes an upper portion and a lower portion. In the present embodiment, the upper portion of the second columnar body 120 comprising second mask layer 108, and the lower portion of the second columnar body 120 comprising sacrificial dielectric material 118 and buffer mask layer 106, in which the sacrificial dielectric material 118 surrounds the buffer mask layer 106. Therefore, the width of the lower portion of the second columnar body 120 is the same as the width of the upper portion of the second columnar body 120.

Figure 6A:
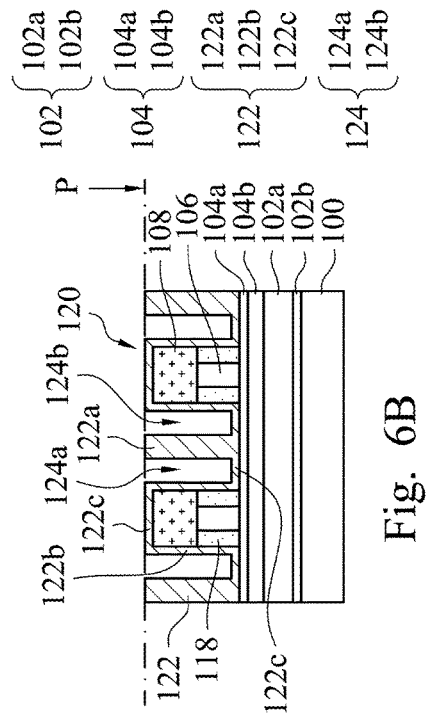
Figure 6B:
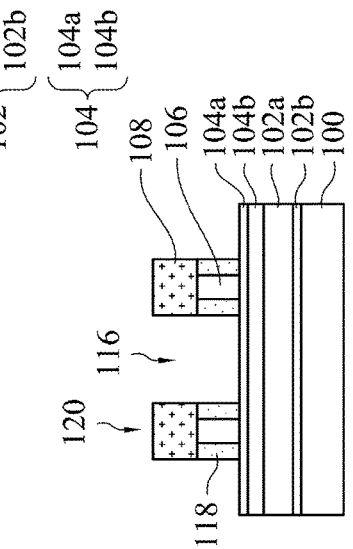

In the embodiment shown in FIGS. 6A and 6B (where the viewing angle of FIG. 6A is a top view of the top surface P in FIG. 6B), the conformal spacer layer 122 is deposited in the second columnar bodies 120. In the present embodiment, the spacer layer 122 having a uniform thickness is covered on the second columnar bodies 120 and the upper hard mask layer 104a. Therefore, the spacer layer 122 has a horizontal portion 122c, which is substantially parallel to the upper surface of the second columnar body 120 and the upper surface of the upper hard mask layer 104a. The spacer layer 122 has a vertical portion 122b, which is parallel to the sidewall 105 of the second columnar body 120. By controlling the thickness of the conformal spacer layer 122, the vertical portion 122b of the spacer layer 122 of the adjacent second columnar bodies 120 is in contact with each other (the spaced columnar body 122a in FIG. 6A). When the vertical portion 122b of the spacer layer 122 of the adjacent second columnar body 120 is in contact with each other, the vertical portion 122b contacting each other forms a spaced columnar body 122a in the cross-sectional view (please referring to the spaced columnar body 122a in FIG. 6A and FIG. 6B, wherein FIG. 6A is the top view of the top surface P in FIG. 6B). The second gaps 124a and 124b are formed on both sides of the spaced columnar body 122a, when the vertical portion 122b of the spacer layer 122 of the adjacent second columnar body 120 is in contact with each other (the second gaps 124a and 124b in FIG. 6A are the second gaps 124a and 124b in FIG. 6B, respectively). The top view (shown in FIG. 6A) of the second gaps 124a and 124b is triangular. Accordingly, by controlling the thickness of the conformal spacer layer 122, the spaced columnar body 122a, the second gaps 124a and 124b are present between the adjacent second column bodies 120. In some embodiments, the method of forming the spacer layer 122 is, for example, atomic layer deposition (ALD), and the material of the spacer layer 122 is the same as the material of the sacrificial dielectric material. For example, the material of the spacer layer 122 is $SiO_2$.

In the embodiment shown in FIGS. 7A and 7B, the spacer layer 122 is anisotropic etched to remove the horizontal portion 122c of the spacer layer 122 and to expose the second mask layer 108. Meanwhile, the horizontal portion 122c of the spacer layer 122, which is in parallel with the upper surface of the upper hard mask layer 104a, is removed, and the upper hard mask layer 104a is exposed. Therefore, after anisotropic etching, the vertical portion 122b of the spacer layer 122 forms a plurality of sidewall spacers 122s on the sidewalls of the second columnar body 120, and the sidewall spacers 122s are separated from the spaced columnar bodies 122a.

In the embodiment shown in FIGS. 8A and 8B, the core mask layer 126 is formed in the second gaps 124 and covers the second columnar body 120 and the sidewall spacers 122s. The material of the core mask layer 126 may be the same as that of the buffer mask layer 106. The material of the core mask layer 126 is, for example, $Si_3N_4$, Si, C, SiON, $SiO_2$, SiCN or SiC.

In the embodiment depicted in FIGS. 9A and 9B, a portion of the core mask layer 126 is removed to expose the second mask layer 108. In the present embodiment, the method of removing the partial core mask layer 126 is, for example, chemical-mechanical planarization (CMP).

In the embodiment depicted in FIGS. 10A and 10B, the second mask layer 108 is removed to expose the buffer mask layer 106 and the sacrificial dielectric material 118. As shown in FIG. 10A, after removing the second mask layer 108, the exposed shape is a circular pattern with the buffer mask layer 106 surrounding by the sacrificial dielectric material 118.

Figure 11A:
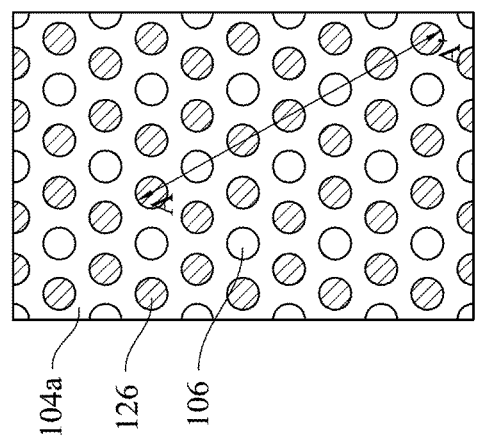
Figure 11B:
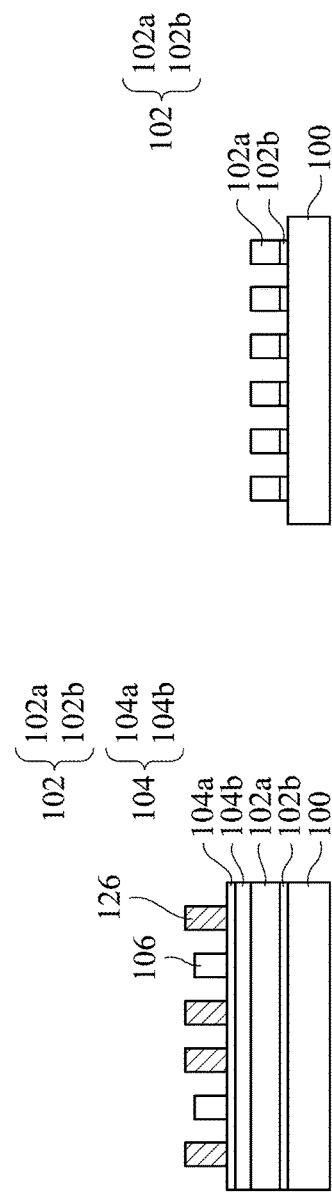

In the embodiment shown in FIGS. 11A and 11B, the sacrificial dielectric material 118 and the spacer layer 122 are removed so that the columnar shaped buffer mask layer 106 and the core mask layer 126 is left on the upper hard mask layer 104a. At this time, the gap between the buffer mask layer 106 and the core mask layer 126 in FIG. 11B has been reduced compare to the first gap 116 between the second columnar bodies 120 in FIG. 2B. Therefore, fine pattern and smaller spacing between the patterns are formed.

Figure 12A:
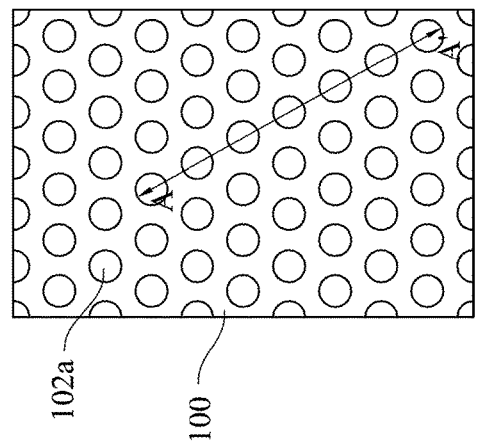
Figure 12B:
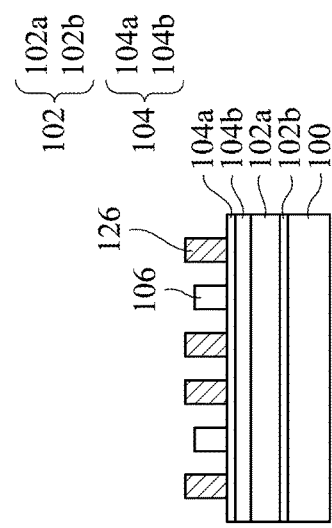

In the embodiment shown in FIGS. 12A and 12B, in order to form a patterned upper hard mask layer 104a and patterned lower hard mask layer 104b, the upper hard mask layer 104a and the lower hard mask layer 104b are removed by using the core mask layer 126 and the buffer mask layer 106 as a mask (not shown). Next, the core mask layer 126 and the buffer mask layer 106 are removed. In order to form the patterned upper bottom layer 102a and lower bottom layer 102b on the substrate 100, a portion of the upper bottom layer 102a and the lower bottom layer 102b is removed by using the patterned upper hard mask layer 104a and the lower hard mask layer 104b. Therefore, in the embodiment of the present disclosure, only one photomask is needed in the process (i.e., only the photomask used to form the patterned photoresist layer 112 in FIG. 1A is needed) to form a pattern that has smaller pattern width and smaller spacing between the patterns compared to the photomask used at the beginning.

In the present embodiment, the sidewalls of the buffer mask layer 106 of the lower portion of the first columnar body 114 are partially etched. Therefore, the buffer mask layer 106 of the lower portion of the first columnar body 114 has a second width $D_2$ smaller than the first width $D_1$ of the patterned photoresist layer 112. Then, by controlling the thickness of the conformal spacer layer 122, a spaced columnar body 122a, the second gaps 124a and 124b are formed between the adjacent second column bodies 120. In this step, the structure formed by the spacer layer 122 can further reduce the distance between the subsequently formed fine patterns. Next, a core mask layer 126 is formed in the second gaps 124. Thereafter, the bottom layer 102 is patterned by the core mask layer 126 and the buffer mask layer 106. The width of the patterned bottom layer 102 is smaller than the width of the patterned photoresist layer 112, and the spacing between the patterned bottom layer 102 is smaller than the spacing between the patterned photoresists layer 112.

In other words, the patterning method of the present disclosure can reduce the patterned size and the spacing between the patterns by using the existing machine and the lithography process, and only one immersion lithography process is needed. Therefore, the cost of the process is greatly reduced and the process margin is improved. In addition, since the steps of the patterning method are fewer and the procedure is simple, the control of the process margin can be made better.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A patterning method comprising:
   sequentially forming a bottom layer, a hard mask layer, a buffer mask layer and at least one mask layer on a substrate;
   patterning the at least one mask layer and the buffer mask layer to form a plurality of first columnar bodies;
   removing a portion of the buffer mask layer in the first columnar bodies;
   filling a sacrificial dielectric material in a plurality of first gaps between the first columnar bodies, wherein the sacrificial dielectric material is flowable oxide or spin-on glass (SOG);
   patterning the sacrificial dielectric material by using the at least one mask layer of the first columnar bodies as a mask to form a plurality of second columnar bodies;
   depositing a conformal spacer layer on the second columnar bodies and forming a spaced columnar body between the adjacent second columnar bodies, wherein a second gap is between the spaced columnar body and the second columnar body;
   etching the conformal spacer layer to expose the hard mask layer under the second gaps;
   forming a core mask layer within the second gaps;
   removing the at least one mask layer and the sacrificial dielectric material; and
   removing a portion of the hard mask layer and the bottom layer by using the core mask layer and the buffer mask layer as a mask.

2. The method according to claim 1, further comprising:
   forming a plurality of columnar patterned photoresists on the at least one mask layer; and
   patterning the at least one mask layer and the buffer mask layer by using the columnar patterned photoresist as a mask.

3. The method according to claim 1, wherein the removing the portion of the buffer mask layer in the first columnar bodies comprises the at least one mask layer has a first width and the remaining buffer mask layer has a second width, and the first width is greater than the second width.

4. The method of claim 1, wherein the removing the portion of the buffer mask layer in the first columnar bodies comprises anisotropic etching the buffer mask layer.

5. The method of claim 1, wherein the depositing the conformal spacer layer on the second columnar bodies and forming the spaced columnar body between the adjacent second columnar bodies, wherein the second gap is between the spaced columnar body and the second columnar body comprises controlling a deposited thickness of the conformal spacer layer to let a vertical portion of the conformal spacer layer covering the adjacent second columnar bodies to be in contact with each other.

6. The method of claim 1, further comprises:
   removing a portion of the core mask layer to expose the at least one mask layer.

7. The method of claim 1, wherein a material of the core mask layer is the same as a material of the buffer mask layer.

8. The method of claim 1, wherein a material of the conformal spacer layer is the same as a material of the sacrificial dielectric material.

9. The method of claim 1, wherein the second columnar body comprising:
   an upper portion, comprising the at least one mask layer; and
   a lower portion, comprising the buffer mask layer and the sacrificial dielectric material.

10. The method of claim 9, wherein the lower portion of the second columnar body comprising a circular pattern with the buffer mask layer surrounding by the sacrificial dielectric material.

11. The method of claim 1, wherein the removing the at least one mask layer and the sacrificial dielectric material further comprises:
    removing the at least one mask layer to expose the sacrificial dielectric material and the buffer mask layer; and
    removing the conformal spacer layer and the sacrificial dielectric material to expose a portion of the hard mask layer.

12. The method of claim 1, wherein the hard mask layer comprises $SiO_2$ and $Si_3N_4$.

13. The method of claim 1, wherein the at least one mask layer comprises $SiO_2$ and $Si_3N_4$.

14. The method of claim 1, wherein the core mask layer comprises $SiO_2$, $Si_3N_4$ and SiON.

15. The method of claim 1, wherein the conformal spacer layer comprises $SiO_2$.

16. The method of claim 1, wherein the buffer mask layer comprises $SiO_2$ and $Si_3N_4$.

17. The method of claim 1, wherein the filling the sacrificial dielectric material in the first gaps between the first columnar bodies comprises the filled sacrificial dielectric material is in contact with a pair of sidewalls of the buffer mask layer.

18. The method of claim 1, wherein the removing the portion of the hard mask layer and the bottom layer by using the core mask layer and the buffer mask layer as the mask further comprises:
    removing the portion of the hard mask layer by using the core mask layer and the buffer mask layer as the mask;
    removing the core mask layer and the buffer mask layer; and removing a portion of the bottom layer by using the remaining hard mask layer as the mask.

19. The method of claim 1, wherein the removing the portion of the buffer mask layer in the first columnar bodies comprises forming a T shape first columnar bodies.

* * * * *